United States Patent
Yamada

(10) Patent No.: US 9,110,613 B2
(45) Date of Patent: Aug. 18, 2015

(54) PRINT CONTROL APPARATUS AND PRINT CONTROL PROGRAM USING COMPRESSION PROCESSING

(71) Applicant: SEIKO EPSON CORPORATION, Tokyo (JP)

(72) Inventor: Kazumi Yamada, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/161,105

(22) Filed: Jan. 22, 2014

(65) Prior Publication Data

US 2014/0293307 A1   Oct. 2, 2014

(30) Foreign Application Priority Data

Mar. 29, 2013  (JP) ................ 2013-071616

(51) Int. Cl.
| | |
|---|---|
| G06F 3/12 | (2006.01) |
| G06K 15/02 | (2006.01) |
| G06F 17/30 | (2006.01) |
| H04N 1/64 | (2006.01) |
| H03M 7/30 | (2006.01) |
| G06T 9/00 | (2006.01) |

(52) U.S. Cl.
CPC ............ *G06F 3/1215* (2013.01); *G06F 3/1276* (2013.01); *G06F 17/30153* (2013.01); *G06K 15/181* (2013.01); *H04N 1/642* (2013.01); *G06K 15/1851* (2013.01); *G06K 15/1865* (2013.01); *G06T 9/005* (2013.01); *H03M 7/30* (2013.01)

(58) Field of Classification Search
None
See application file for complete search history.

(56) References Cited

U.S. PATENT DOCUMENTS

| | | | | |
|---|---|---|---|---|
| 5,638,498 | A * | 6/1997 | Tyler et al. | 358/1.18 |
| 2005/0105138 | A1 * | 5/2005 | Lapstun et al. | 358/3.13 |
| 2008/0137135 | A1 * | 6/2008 | Takeishi | 358/1.15 |
| 2009/0141320 | A1 | 6/2009 | Minamino | |
| 2009/0297051 | A1 | 12/2009 | Nonaka et al. | |
| 2012/0050766 | A1 * | 3/2012 | Saiki | 358/1.9 |
| 2013/0003101 | A1 * | 1/2013 | Fujisawa et al. | 358/1.13 |
| 2014/0177957 | A1 * | 6/2014 | Clark | 382/166 |
| 2014/0293301 | A1 * | 10/2014 | Yamada | 358/1.9 |

FOREIGN PATENT DOCUMENTS

| | | |
|---|---|---|
| EP | 2547087 A1 | 1/2013 |
| JP | 2002-152506 A | 5/2002 |

(Continued)

OTHER PUBLICATIONS

The extended European Search Report for European Application No. 14159074.5 mailed Dec. 2, 2014.

*Primary Examiner* — Miya J Cato
(74) *Attorney, Agent, or Firm* — Global IP Counselors, LLP

(57) ABSTRACT

A print control apparatus including an image acquisition unit for acquiring an image file including on one page a plurality of sets of image data of a raster format for representing an object, a compression processing unit for selecting methods of compression to apply to each of the plurality of sets of image data from among a plurality of methods of compression, in accordance with the properties of the image data, and compressing each of the plurality of sets of image data by the respectively selected methods of compression, a PDL data generation unit for generating PDL data, which is PDL data in which a command to print the image file is described by a page description language and which includes the plurality of sets of compressed image data, and a transfer unit for transferring the generated PDL data to a print unit.

11 Claims, 12 Drawing Sheets

(56) References Cited

FOREIGN PATENT DOCUMENTS

| JP | 2005-318130 A | 11/2005 |
| JP | 2009-027385 A | 2/2009 |
| JP | 2009-290389 A | 12/2009 |
| JP | 2010-103997 A | 5/2010 |

* cited by examiner

DESIGNATED IMAGE

| Resolution Of Printing | Threshold Value TH1 |
|---|---|
| ⋮ | ⋮ |
| 360dpi | 120dpi |
| 600dpi | 300dpi |
| 1200dpi | 600dpi |
| ⋮ | ⋮ |

TABLE T1

Fig. 4

DESIGNATED IMAGE

DESIGNATED IMAGE

PRINT CONTROL APPARATUS AND PRINT CONTROL PROGRAM USING COMPRESSION PROCESSING

CROSS-REFERENCE TO RELATED APPLICATIONS

This application claims priority to Japanese Patent Application No. 2013-071616 filed on Mar. 29, 2013. The entire disclosure of Japanese Patent Application No. 2013-071616 is hereby incorporated herein by reference.

BACKGROUND

1. Technical Field

The present invention relates to a print control apparatus and a print control program.

2. Background Technology

There is a need for what is called high-speed printing, in which more printing is executed by a printer in less time. Included as one of the important elements for achieving high-speed printing is a reduction in the time required for transferring the necessary information to the printer (the transfer time). Compressing and reducing the amount of information being transferred is an effective manner of reducing the transfer time. There is, also, a known configuration in which image data in inputted from an input unit, a selection is made with a selector, depending on a signal inputted from the input unit, between either a lossless compression unit or a lossy selection unit, and image data that has been compressed by the selected compression unit is outputted from an output unit (see Patent Document 1).

Japanese Laid-open Patent Publication No. 2009-290389 (Patent Document 1) is an example of the related art.

SUMMARY

Problems to be Solved by the Invention

One page to be printed by a printer can in some instances include a plurality of objects. "Objects" as mentioned herein refer to objects or subjects that are represented on the page, and more specifically to regions that are represented having a certain extent of being therein, such as photographs, text (characters), graphics, and the like. For example, when there are some regions on a page including a region of photograph, a region of characters, a region of graphics and so on, each of the regions is handled severally as one area. In such a case, a plurality of sets of image data corresponding to each of the objects are present in an image file that retains the content of the page as digital data. In a case where, in such circumstances, the image file is compressed by a given method of compression, then, depending on the method of compression employed, either certain objects would suffer intense degradation of image quality (degradation of the image quality of when the compressed state is decompressed (or decompressed or stretched), for which the reference would be the image quality before compression; the same applies hereinbelow as well), or also an effect of compression of the expected extent would not be obtained for certain objects. The document mentioned above is not a technology that anticipates instances where a plurality of sets of image data corresponding to a plurality of objects are present in one page, and therefore does not solve the problems described above, which can arise with respect to each of the objects.

The invention has been created in order to solve at least the problems described above, and provides a print control apparatus and print control program which, in circumstances where a plurality of objects are present in one page, are able to contribute to reducing the transfer time by accurately reducing the amount of information being transferred, while also minimizing degradation of image quality, and thus to achieve printing of an unprecedented high speed.

Means Used to Solve the Above-Mentioned Problems

One aspect of the invention is a print control apparatus provided with: an image acquisition unit for acquiring an image file including on one page a plurality of sets of image data of a raster format for representing an object; a compression processing unit for selecting methods of compression to apply to each of the plurality of sets of image data from among a plurality of methods of compression, in accordance with the properties of the image data, and compressing each of the plurality of sets of image data by the respectively selected methods of compression; a PDL data generation unit for generating PDL data, which is PDL data in which a command to print the image file is described by a page description language and which includes the plurality of sets of compressed image data; and a transfer unit for transferring the generated PDL data to a print unit.

According to the configuration of the invention, the plurality of sets of image data for representing respective objects included in one page are compressed by methods of compression that are optimal in accordance with the properties thereof. For this reason, transferring the PDL data including each of the sets of compressed image data reduces the time needed to transfer the PDL data. As a result, printing of an unprecedented high speed is realized. Also, according to the invention, each of the sets of image data in the one page is compressed by the optimal method of compression corresponding to the respective properties thereof, therefore avoiding a defect where image quality is considerably degraded for a given object or the expected extent of efficacy in compression is not obtained. That the "methods of compression are different" in the present application has a significance encompassing cases where the difference is in whether the methods are a lossless compression or lossy compression, cases where the difference is in the specific compression formats (for example, JPEG format and RHV2 formation), and cases where the compression formats can be the same but the parameters, quantization tables, or rates of compression used for the compression processing are different. As such, the compression processing unit can, for example, select methods of compression that are the same compression format but are of different rates of compression for each of the plurality of sets of image data.

As one aspect of the invention, the compression processing unit can select a method of compression with which there is less compressed data than there is data after the image data is converted to PDL data in accordance with the properties of the image data. According to this configuration, the amount of data is reliably reduced in terms of the PDL data including each of the sets of compressed image data, more so than a case where the content of each of the sets of image data is converted to PDL. As one aspect of the invention, in a case where first image data and second image data included in the plurality of sets of image data are adjacent to one another, then the compression processing unit can select, for a range in the first image data of a part that is adjacent to the second image data and a range in the second image data of a part that is adjacent to the first image data, a third method of compression different from both a first method of compression selected for the first image data and a second method of compression selected for the second image data, and compress the range for which the third method of compression is selected by the third method of compression. According to this configuration, selecting the third method of compression so as to be such a method of compression as to achieve an image quality substantially in the middle between the image quality of a case where the first method of compression is employed and the image quality of a case where the second method of compression is employed makes it possible to avoid circumstances where the image quality changes rapidly between the first image data and the second image data on the one page.

As one aspect of the invention, the properties can be the resolution of the image data, and the compression processing unit can select the methods of compression in accordance with a comparison between the resolution of the image data and a threshold pertaining to resolution. According to this configuration, it is possible to select a method of compression for each of the sets of image data that achieves an optimal balance between reducing the amount of information transferred to the print unit and minimizing the degradation of image quality, in accordance with the resolutions of each of the sets of image data. As a specific example of such a case, the compression processing unit can select a method of compression by lossy compression in a case where the resolution of the image data is equal to or greater than the threshold pertaining to resolution, and select a method of compression by lossless compression in a case where the resolution of the image data is less than the threshold pertaining to resolution.

As one aspect of the invention, the compression processing unit can cause the threshold pertaining to resolution to be different depending on a resolution of printing by the print unit. According to this configuration, the threshold is set in accordance with the resolution of printing by the print unit, and therefore it is possible to achieve an optimal balance between reducing the amount of information transferred to the print unit and minimizing the degradation of image quality. As one aspect of the invention, the properties can be the resolution of the image data, and the compression processing unit can select a method of compression by lossless compression in a case where a conversion rate in a resolution conversion for matching the resolution of the image data to the resolution of printing of the print unit is equal to or greater than a threshold pertaining to the conversion rate, and select a method of compression by lossy compression in a case where the conversion rate is less than the threshold pertaining to the conversion rate. According to this configuration, the optimal method of compression can be selected in accordance with the magnitude of the conversion rate obtained from the comparison between the resolution of the image data and the resolution of printing of the print unit.

As one aspect of the invention, the properties can be the number of pixels constituting the image data, and the compression processing unit can select the method of compression in accordance with a comparison between the number of pixels of the image data and a threshold pertaining to the number of pixels. According to this configuration, it is possible to select a method of compression for each of the sets of image data that achieves an optimal balance between reducing the amount of information transferred to the print unit and minimizing the degradation of image quality, in accordance with the number of pixels of each of the sets of image data.

As one aspect of the invention, the compression processing unit can select a specific compression format in a case where the number of pixels in a specific direction highly correlated to the compression rate according to the specific compression format is greater than a threshold pertaining to the number of pixels in the specific direction. According to this configuration, it is possible to accurately select the specific compression format for image data more readily manifesting the effects of compression by the specific compression format.

As one aspect of the invention, the properties can be the types of images represented by the image data. According to this configuration, it is possible to select a method of compression for each of the sets of image data that achieves an optimal balance between reducing the amount of information transferred to the print unit and minimizing the degradation of image quality, in accordance with the types of images represented by each of the sets of image data.

The technical concept as in the invention need not be realized only in the form of a print control apparatus, but rather can be embodied by other forms. It would also be possible to comprehend the invention of a method (a print control method) including steps corresponding to the features of the print control apparatus in any of the aspects described above, the invention of a print control program for causing a predetermined hardware (a computer) to execute the method, or the invention of a computer-readable recording medium in which the program is recorded. The print control apparatus can be realized by a single apparatus or can be realized by the combination of a plurality of apparatuses. Further, in a case where the print apparatus is realized by a combination of a plurality of apparatuses, then it would also be possible to comprehend the invention of a system constituted of the plurality of apparatuses, or a method corresponding to the system.

BRIEF DESCRIPTION OF THE DRAWINGS

Referring now to the attached drawings which form a part of this original disclosure:

FIG. 4 is a drawing illustrating an example of a table that defines relationships of correspondence between a print resolution and a threshold;

DETAILED DESCRIPTION OF EXEMPLARY EMBODIMENTS

The following is a description of embodiments of the invention, with reference to the accompanying drawings.

1. OVERVIEW OF THE APPARATUSES

Figure 1:
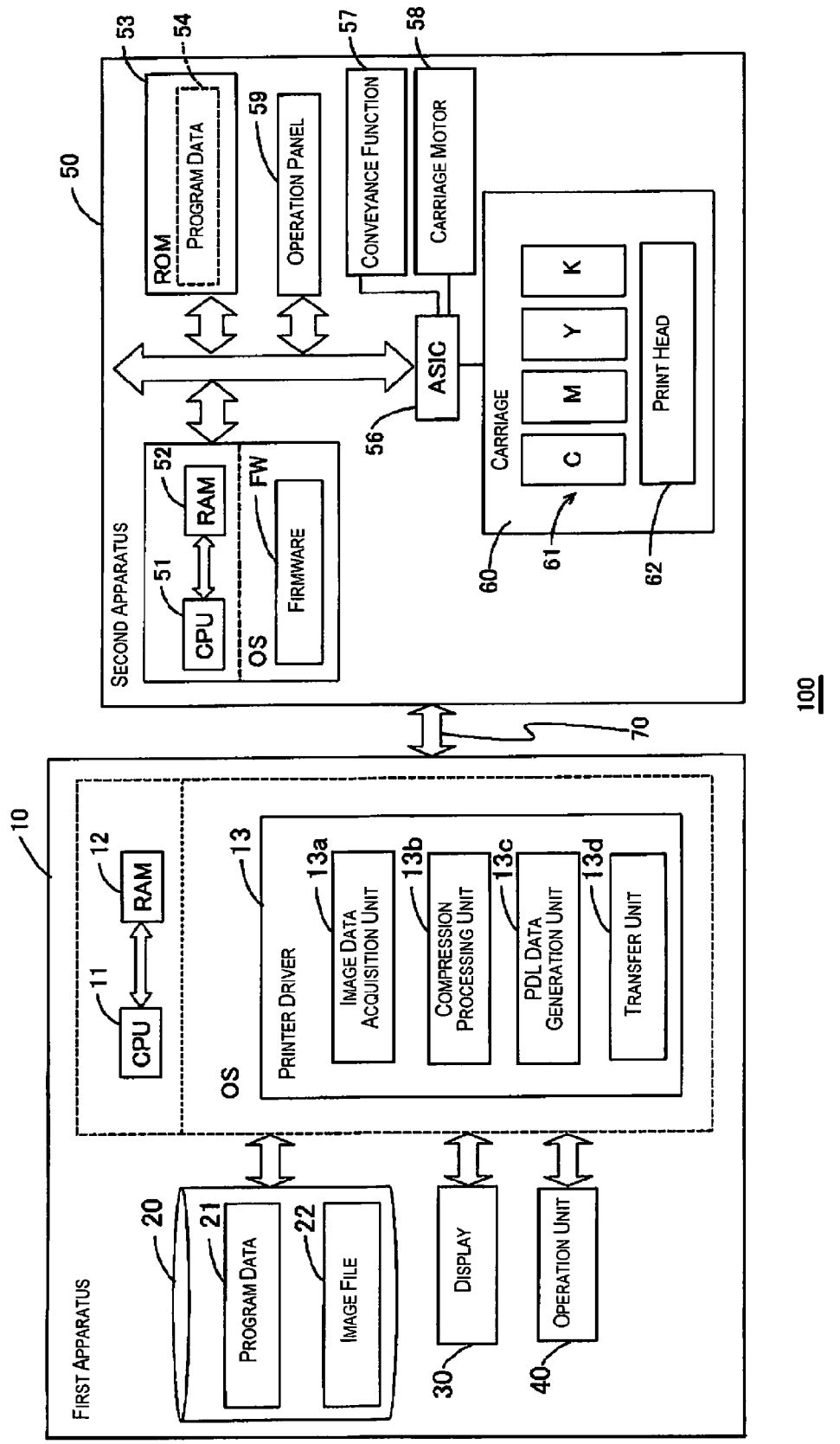
FIG. 1 is a drawing schematically illustrating a hardware configuration and a software configuration.

FIG. 1 schematically illustrates a hardware configuration and a software configuration as in the present embodiment. In FIG. 1, a first apparatus 10 and a second apparatus 50 are illustrated. The first apparatus 10 has a function for controlling the second apparatus 50 and causing the second apparatus 50 to execute printing; for example, a personal computer (PC), server, mobile terminal apparatus, and the like would apply. The second apparatus 50 is a printer. A "printer" refers (JIS X0012-1990) to an output apparatus for making a hard copy recording of data, a principal form of which is discrete columns of graphic characters belonging to one or a plurality of previously established character sets. In many instances, a printer can also be used as a plotter. A "plotter" refers (JIS X0012-1990) to an output apparatus for directly producing a hard copy recording of data in the form of two-dimensional graphics on a removable medium. Provided that the second apparatus 50 can function as a printer, the second apparatus 50 can also be a so-called multifunction peripheral that functions also as a scanner and a copier.

The first apparatus 10 applies as one example of a print control apparatus. Alternatively, a system 100 including the first apparatus 10 and the second apparatus 50 can be understood to be the print control apparatus, or it would also be possible to understand only the second apparatus 50 to be a print control apparatus. The second apparatus 50, either in the entirety thereof or at least partially, applies as a print unit. Further, the first apparatus 10 and the second apparatus 50 are not to be presumed only to each respectively be an individual apparatus. The first apparatus 10 and the second apparatus 50 can be understood to apply as each of the parts in a single, integrally configured product, and the present embodiment also encompasses a configuration in which a part of this product functions as the first apparatus 10 and another part functions as the second apparatus 50.

In the first apparatus 10, a printer driver 13 for controlling the second apparatus 50 is executed by a CPU 11 deploying program data 21 that is stored in a hard disk drive (HDD) 20 or the like to a RAM 12 and carrying out operations in accordance with the program data 21 under an operating system (OS). The printer driver 13 is a program for causing the CPU 11 to execute a variety of functions of an image acquisition unit 13a, a compression processing unit 13b, a PDL data generation unit 13c, a transfer unit 13d, and the like. Each of these functions shall be described in greater detail below.

Connected to the first apparatus 10 is a display 30 serving as a display unit; the display 30 displays a user interface (UI) screen needed for a variety of processes. The first apparatus 10 is provided as appropriate with an operation unit 40 achieved by, for example, a keyboard, mouse, or a variety of buttons, a touch pad, a touch panel, or the like, and instructions that are needed for respective processes are inputted via the operation unit 40 by the user. The first apparatus 10 is connected so as to be able to communicate with the second apparatus 50 by a transfer path 70. The transfer path 70 is a general term for an either wired or wireless communication pathway. In a case where the first apparatus 10 and the second apparatus 50 are an integrated product, as described above, then the transfer path 70 is a communication pathway within this product. As will be described below, in the first apparatus 10, PDL data is generated by the function of the printer driver 13, and the PDL data is transmitted to the second apparatus 50 via the transfer path 70.

In the second apparatus 50, firmware FW for controlling is executed by a CPU 51 deploying program data 54 that is stored in a ROM 53 or the like to a RAM 52 and carrying out operations in accordance with the program data 54 under an OS. The firmware FW performs as appropriate such executions as interpreting a command or decompressing compressed data to generate print data, on the basis of the PDL that is transmitted from the first apparatus 10. Then, sending the print data to an application-specific integrated circuit (ASIC) 56 makes it possible to cause printing that is based on the print data to be executed.

The ASIC 56 acquires the print data and generates a drive signal for driving, for example, a conveyance mechanism 57, a carriage motor 58, or a print head 62 on the basis of the print data. The print head 62 applies as a permanent head, and refers (JIS Z8123-1: 2013) to a mechanical part or electrical part of a main printer body that continuously or intermittently generates liquid droplets of ink. The second apparatus 50 is provided with, for example, a carriage 60, and the carriage 60 is loaded with a cartridge 61 for each of a plurality of types of ink. The example in FIG. 1 is loaded with cartridges 61 corresponding to a variety of liquids: cyan (C), magenta (M), yellow (Y), and black (Y). The specific types or number of inks used by the second apparatus 50 are not limited to what is described above; for example, it would be possible to use a variety of inks, such as light cyan, light magenta, orange, green, gray, light gray white, metallic, and so forth. The cartridges 61 also need not be loaded into the carriage 60, but can rather be installed at a predetermined position in the second apparatus 50.

The carriage 60 is provided with the print head 62, which sprays (ejects) from a plurality of ink ejection holes (hereinafter, "nozzles") the inks that are supplied from each of the cartridges 61. As such, the second apparatus 50 applies as an inkjet printer. An inkjet printer refers (JIS X0012-1990) to a non-impact printing apparatus wherein characters are formed by particles or small droplets of ink on paper. Provided in the print head 62 are piezoelectric elements for causing the ink droplets (dots) to be sprayed from the nozzles, the piezoelectric elements respectively corresponding to the nozzles. The piezoelectric elements are deformed when the above-mentioned drive signal is applied, and cause the dots to be ejected from the corresponding nozzles. The conveyance mechanism 57 is provided with a paper-feeding motor and paper-feeding rollers (not shown), and conveys a print substrate along a feed direction by being subjected to a drive control by the ASIC 56. The "feed direction" refers to the orientation of a geometric vector involved in the movement of the print substrate when the print substrate and the head face each other.

The print substrate refers to a material that retains a printed image. The shape is generally rectangular, but can in some instances be circular (for example, optical discs such as CD-ROMs and DVDs), triangular, quadrangular, polygonal, and so forth; at least all of the types of paper and paperboard products and processed products set forth in the Japanese Industrial Standard "JIS P0001:1998—Paper, board and pulp" are included. More specific examples include sheet-fed paper, roll paper, board paper, paper, non-woven fabric, cloth, ivory board, asphalt paper, art paper, colored board, colored wood free paper, inkjet printing paper, SENKA printing paper, printing paper, printing paper grade A, printing paper grade B, printing paper grade C, printing paper grade D, India paper, printing tissue paper, Japanese tissue paper, back carbon paper, air mail paper, sanitary paper, embossed paper, optical character recognition (OCR) paper, offset printing paper, cardboard, chemical fiber paper, converting paper, Gasen-shi, pattern paper, machine glazed kraft paper, wall paper base, thread paper, pressure sensitive copying paper, light sensitive paper, thermal recording paper, Ganpi-shi, can board, straw board, imitation leather paper, ticket paper, high performance paper, cast coated paper, Kyohana-gami, Japanese vellum, metallized paper, metal foil paper, glassine, rotogravure paper, kraft paper, extensible kraft paper, kraft board, crepe paper, lightweight coat paper, cable insulating paper, saturating decorative paper, building material base, Kent paper, abrasive paper base, synthetic paper, synthetic fiber paper, coat paper, capacitor tissue paper, miscellaneous paper, woody paper, bleached craft paper, diazo sensitized paper, core paper, magnetic recording paper, boxboard, dictionary paper, lightproof paper, heavy duty sack kraft paper, machine glazed paper, security paper, Shoji-gami, wood free paper, communication paper, food paper, book paper, Shodo-yoshi, white lined board, white lined chipboard, newsprint, blotting paper, water-soluble paper, drawing paper, ribbed kraft paper, laid paper, speaker cone paper, dielectric-coated paper, cellulose wadding, industrial laminate base, gypsum liner board, adhesive and release paper base, printing paper grade B—special, cement sack paper, ceramic paper, solid fiberboard, tar paper, tarpaulin paper, alkali-resistant paper, fire-resistant paper, acid-resistant paper, greaseproof paper, towel paper, Dan-shi, corrugated fiberboard, liner and corrugating medium, map paper, chip board, wood containing paper, alkaline paper, Chiri-gami, mat art paper, tea bag paper, soft tissue, electrical insulating paper, Tengujo, pasted paper, transfer paper, toilet tissue paper, paper for punched cards, stencil base paper, coated printing paper, coating base paper, Torinoko, tracing paper, fluting medium, napkin paper, flame resistant paper, paper for non-impact printing (NIP), tag paper, pressure-sensitive adhesive paper, carbonless copy paper, release paper, machine glazed brown wrapping paper, baryta paper, paraffin paper, waxed paper, vulcanized fiber, Han-shi, paper for indirect electrostatic process, writing paper, ultra lightweight coat paper, business form, continuous business form, manifold base paper, press board, moisture proof paper, Hosho-shi, waterproof paper, non-tarnish paper, wrapping paper, bond paper, manila board, Mino-gami, Shoin-gami, milk carton board, simile paper, oiled paper, Yoshino-gami, rice paper, cigarette paper, linear board, liner, vegetable parchment, kraft paper, roofing paper, filter paper, Japanese Washi paper, varnished paper, wrapper, lightweight paper, air-dried paper, wet strength paper, ashless paper, acid free paper, paper or board without finish, two-layer paper or board, three-layer paper or board, multi-layer paper or board, unsized paper, sized paper, wove paper, veined paper or board, machine-finished paper or board, machine-glazed paper or board, plate-glazed paper or board, friction-glazed paper or board, calendared paper or board, super calendared paper, lamine (paper or board), one-sided colored paper or board, two-sided colored paper or board, twin wire paper or board, rag paper, all-rag paper, mechanical wood pulp or board, mixed straw paper or board, water-finished paper or board, chipboard, lined chipboard, millboard, glazed millboard, solid board, mechanical pulp board, brown mechanical pulp board, brown mixed pulp board, leatherfiber board, asbestos board, felt board, tarred brown paper, waterleaf paper, surface sized paper, presspahn, press paper, cockle finished paper, pasted ivory board, blade coated paper, roll coated paper, gravure coated paper, size press coated paper, brush coated paper, air knife coated paper, extrusion coated paper, dip coated paper, curtain coated paper, hot melt coated paper, solvent coated paper, emulsion coated paper, bubble coated paper, imitation art paper, bible paper, poster paper, wrapping tissue, base paper, carbonizing base paper, base paper for diazotype, photographic base paper, base paper for the protection of frozen and deep-frozen foods (i.e. direct contact), base paper for the protection of frozen and deep-frozen foods (i.e. non-contact), safety paper, banknote paper, insulating paper or board, paper for laminated insulators, paper for conductor insulation, shoe board, paper for textile paper tubes, jacquard paper or board, board for pressing, bookbinding board, suitcase board, flong, archival paper, kraft line, test liner, kraft faced liner, couverture ordinaire, envelope paper, folding boxboard, coated folding boxboard, bleached lined folding boxboard, typewriting paper, stencil duplicator copy paper, spirit duplicator copy paper, calendar bowl paper, ammunition cartridge, fluting paper, fluted paper, union paper, reinforced union paper, cloth-lined paper or board, cloth centered paper or board, reinforced paper or reinforced board, pasted lined board, carton compact, facing, molded pulp products, wet crepe, index card, carbon paper, multi copy business form, carbonized forms, carbonless copy paper forms, correspondence envelope, post card, illustrated post card, letter card, illustrated letter card, and the like. In particular, high performance paper is not limited to plant fibers, and a wide range of materials are used, include inorganic, organic, and metal fiber; high performance paper encompasses paper that is given high performance in paper-making and treatment processes and is mainly used as materials for cutting-edge fields such as information, electronics, and medicine, but there is no limitation thereto.

The controlling of the drive of the carriage motor 58 by the ASIC 56 causes the carriage 60 (and the print head 62) to move along a direction (a scanning axis direction) that intersects with the feeding direction, and the ASIC 56 causes the print head 62 to eject the ink from each of the nozzles in association with this movement. This causes the dots to adhere to the print substrate, and causes an image that is based on the print data to be reproduced on the print substrate. The term "intersects" mentioned above signifies orthogonality here. However, the term "orthogonal" referred to in the present specification does not signify only a rigid angle of 90°, but rather has a significance that encompasses an error of angle of an extent that is acceptable for the quality of the product.

The second apparatus 50 is further provided with an operation panel 59. The operation panel 59 includes a display unit (for example, a liquid crystal panel), a touch panel that is formed within the display unit, and a variety of buttons or keys, and accepts an input coming from a user, displays a required UI screen on the display unit, and so forth. The second apparatus 50 is not limited to being a serial printer in which the print head 62 moves along the scanning axis direction, as is described above. A "serial printer" refers (JIS X0012-1990) to a printing apparatus that prints one character at a time. For example, the second apparatus 50 can be a head for a line printer, in which a plurality of columns of nozzles for each type of ink are arranged side by side in the feeding direction, nozzles being arranged side by side along the scanning axis direction in the columns. A "line printer" refers (JIS X0012-1990) to a printing apparatus that prints a row of characters as a unit. The means for ejecting the dots from the nozzles is also not limited to the piezoelectric elements described above, but rather a means for heating the ink using a heating element and causing the dots to be ejected from the nozzles can also be employed. Further, the format of printing employed by the printer (the second apparatus 50) need not be limited to being the inkjet format described above, but can rather be a laser format or thermal format.

2. PRINT CONTROL PROCESS

The following describes a plurality of embodiments included in the mode for implementing the invention achieved under the configuration described above.

First Embodiment

Figure 2:
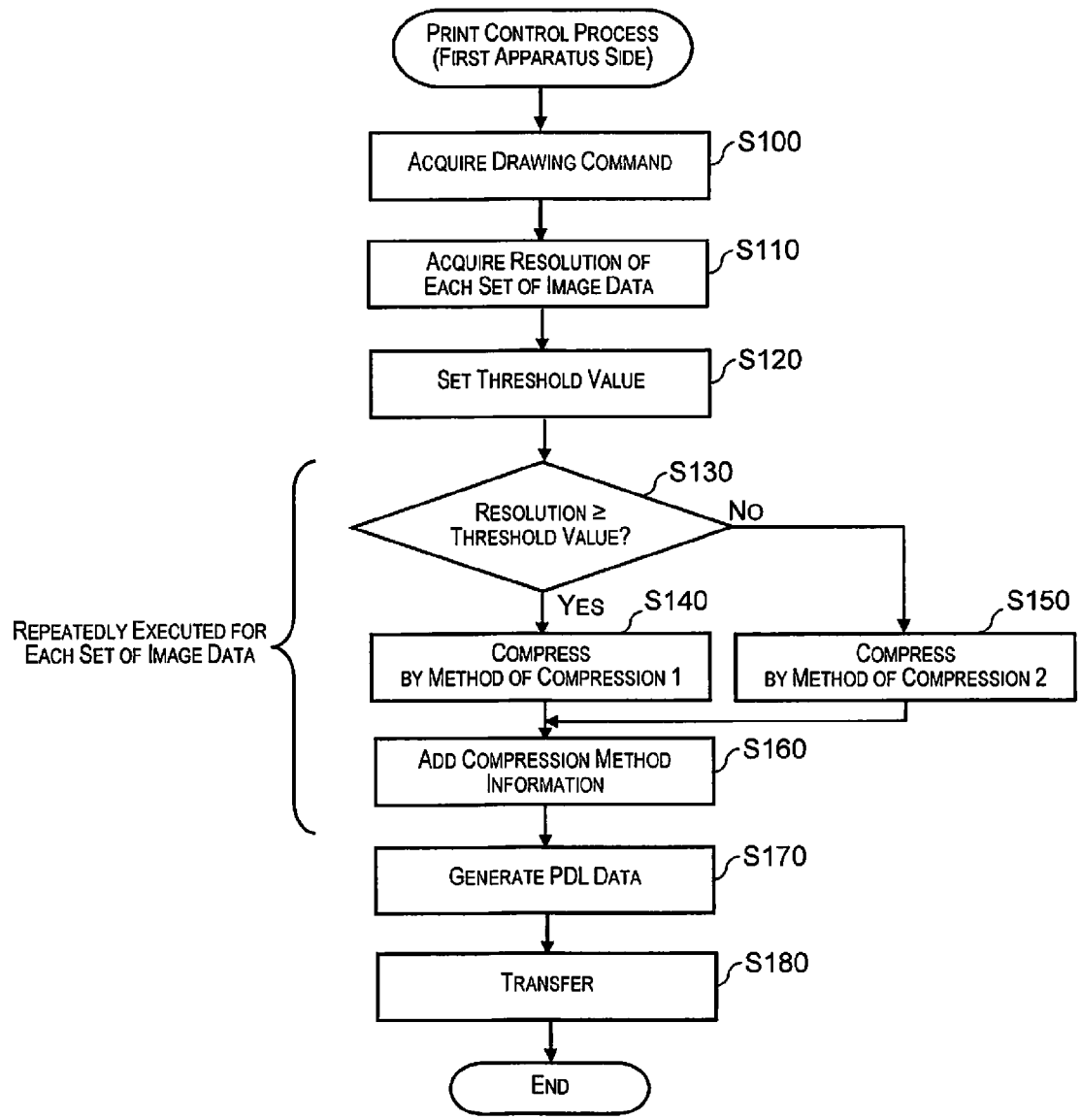
FIG. 2 is a flow chart illustrating a process that is executed on a first apparatus side in a first embodiment.

In FIG. 2, a flow chart illustrates print control process as in the first embodiment, wherein the process is executed on the first apparatus 10. Herein, the CPU 11 is described as executing this flow chart using the printer driver 13 (one type of print control program). A condition for the flow chart to be started up is a state where operating of the operation unit 40 by the user has caused desired application software to be booted up in the first apparatus 10, and an image to be printed by the second apparatus 50 has been selected as desired by the user.

Herein, an "image" refers to a photograph, painting, illustration, graphic, text, or the like that is visible to human eyes, and is for appropriately representing the shapes, colors, and perspective of an original. "Image data" signifies digital data for representing an image. Vector data, bitmapped images, and the like are included as applying as image data. "Vector data" refers to image data that is stored as a set of instructions and parameters for representing geometric shapes such as straight lines, circles, and arcs. A "bitmapped image" refers to image data that is described by an array of pixels. Bitmapped images can also be a term for image data that is in a raster format. "Pixels" are the smallest element constituting an image to which a color and brightness can be independently assigned. "Half-tone" refers to an image constituted of points of different densities or shapes, sizes, or screen ruling. A half-tone is generated by dithering, error diffusion, and the like. "Half-tone dots" refers to the individual elements that constitute the tone. Half-tone dots can have a variety of shapes, such as square, round, or elliptical.

Below, an image that has been selected as desired by the user is called a designated image. The user operates the operation unit 40 to cause a UI screen for print condition setting to be displayed on the display 30. In this state, the printer driver 13 receives, according to the user input, a print instruction of the designated image as well as the selection of the print conditions for causing the second apparatus 50 to print the designated image. For example, the printer driver 13 can accept, in accordance with the user input, a variety of print conditions such as a print mode (print speed, print resolution), the type of print substrate, the orientation of printing, as assignment regarding the paper surface, or whether two-sided printing is needed.

In step S100, the image acquisition unit 13a acquires a drawing command from the application software. Transmission of the drawing command from the application software is triggered by the print instruction, and the drawing command includes an image file 22 that represents the designated image. The image file 22 is generated by the application software, and is acquired from a predetermined storage region, e.g., the HDD 20 or a memory apparatus that is mounted onto a connector for external connection (not shown).

Figure 3:
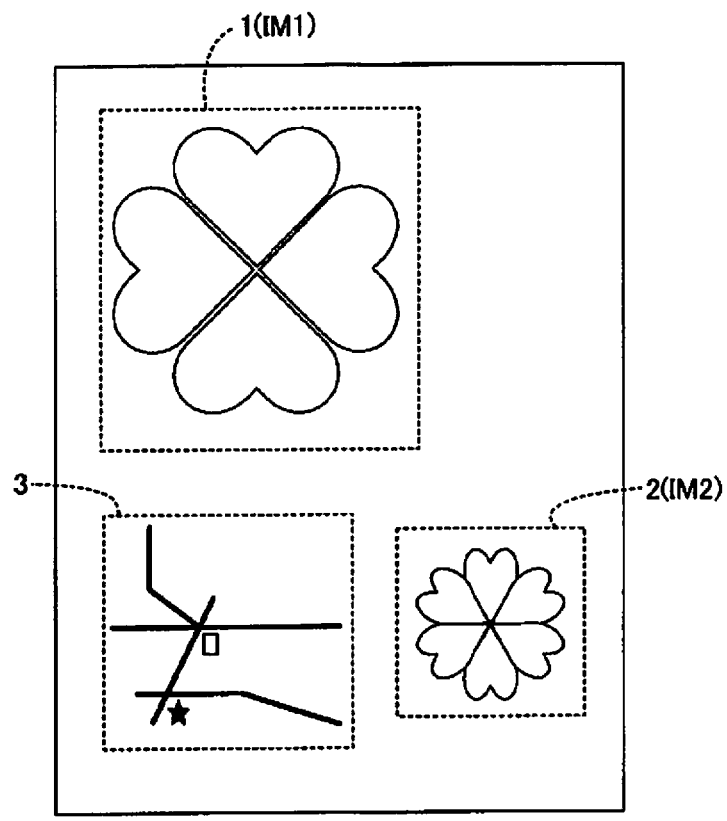
FIG. 3 is a drawing schematically illustrating one example of a designated image.

FIG. 3 is a drawing schematically illustrating one page of a designated image (document) represented by the image file 22. The designated image includes, on one page, a plurality of sets of image data of a raster format for representing objects. The designated image includes, for example, a photographic image 1, a photographic image 2, and a graphic image 3. The photographic image is a photograph that the user has captured using a first imaging device (a digital still camera), and the photographic image 2 is a photograph that the user has captured using a second imaging device. The photographic image 1 is represented by image data IM1 of a raster format, and the photographic image 2 is represented by image data IM2 of a raster format. Herein, the image data IM1, IM2 are data with which a given subject (for example, a flower) is represented in gradation by color information (for example, red (R), green (G), and blue (B)) for every pixel. As such, the step S100 could also be said to be a step for acquiring an image file which includes, on one page, a plurality of sets of image data of a raster format for representing objects. The graphic image 3 is computer graphics (CG), and is represented by a vector format.

In step S110, the compression processing unit 13b acquires the resolution (in dpi) of each of the sets of image data of a raster format included in the one page of the designated image. In the example of FIG. 3, the compression processing unit 13b acquires the respective resolutions of the image data IM1, IM2. These resolutions can be acquired by, for example, consulting appended information (so-called Exif information, or the like) for each of the photographic images that is described by the image file 22, or by analyzing the image data IM1, IM2.

In step S120, the compression processing unit 13b sets a threshold TH1 for comparing against the resolutions acquired in step S110. The threshold TH1 can involve setting one absolute value that is defined in advance, or, as shall be described below, can involve setting a value that differs depending on the resolution of printing (output resolution) by the print unit. The resolution of printing is essentially accepted according to a user input via the UI screen, but in a case where the user has not selected a resolution of printing in particular, a value that has been specified as a default resolution of printing for the printer (the second apparatus 50) would be used.

FIG. 4 illustrates an example of a table T1 that is referenced in the setting of the threshold TH1 according to the resolution of printing. The table T1 is saved in advance in a predetermined storage region (the HDD 20 or the like). Alternatively, the compression processing unit 13b can have the table T1 inputted from an external server or the like via a network (not shown) or the like. The table 1 specifies different thresholds TH1 for different resolutions of printing. Essentially, a higher resolution of printing correlates to the thresholds TH1 being specified as being a higher value. The table T1 can also specify different thresholds TH1 so as to correspond to every range of numerical values of when the resolution of printing is separated into a plurality of ranges of numerical values. The compression processing unit 13b selects one threshold TH1 that corresponds to the resolution of printing by referring to the table T1, and sets the selected threshold TH1 to be the threshold that is used in step S130, described below.

In step S130, the compression processing unit 13b selects as image data to be processed one of the sets of image data (for example, the image data IM1) of the plurality of sets of image data of a raster format that are included in the one page of the designated image, and compares the resolution that was acquired in step S110 for the image data to be processed with the threshold TH1 that was set in step S120. The flow proceeds to step S140 in a case where the resolution is the threshold TH1 or higher, and proceeds to step S150 in a case where the resolution is less than the threshold TH1.

The compression processing unit 13b compresses the image data to be processed by a method of compression 1 in a case where the flow proceeds to step S140, and compresses the image data to be processed by a method of compression 2 different from the method of compression 1 in a case where the flow proceeds to step S150. In the first embodiment, the method of compression 1 signifies a method of compression by lossy compression, and the method of compression 2 signifies a method of compression by lossless compression. For example, a method of compression by a JPEG format would apply as a method of compression 1, and a method of compression by a RHV2 format would apply as a method of compression 2. An RHV2 format refers to a method of compression in which one raster (one row) in image data of a raster format of 8 bits per color is compared with the one raster immediately prior and the difference thereof is acquired as information.

In step S160, the compression processing unit 13b adds information indicative of the method of compression implemented (compression method information) to the image data that has been subjected to compression in step S140 or step S150. In other words, in a case where the flow passes through step S140, then compression method information indicating the method of compression 1 is added to the compressed image data, and in a case where the flow passes through step S150, then compression method information indicating the method of compression 2 is added to the compressed image data. The compression processing unit 13b repeatedly executes the processes of steps S130 to S160 of such description on each of the plurality of sets of image data of a raster format (the image data IM1 and the image data IM2, according to the example in FIG. 3) included in the one page of the designated image.

In step S170, the PDL data generation unit 13c generates PDL data in which a command for causing the printer (the second apparatus 50) to print the designated image is described by a page description language that can be interpreted by the printer. The PDL data is vector data in which the positions and content of each of the objects arranged in the page are described overall, but in the present embodiment, the PDL data includes the compressed image data produced by the step S140 or step S150. For the PDL data to "include" the compressed image data could also be expressed by saying that the sets of data are inserted into, affixed to, embedded in, or the like, inside the PDL data. "Embedded" here signifies both a case where the substance of the data is embedded in the PDL data as well as a case where the substance is not present in the PDL data, but rather link information indicative of the position where the substance is found (link information enabling access to the substance) is embedded in the PDL data. The compression method information has also been added to the compressed image data included in the PDL data.

In step S180, the transfer unit 13b transfers the PDL data generated in step S170 to the print unit (the second apparatus 50) via the transfer path 70. The PDL data also include information involving the print conditions that have been selected by the user.

Figure 5:
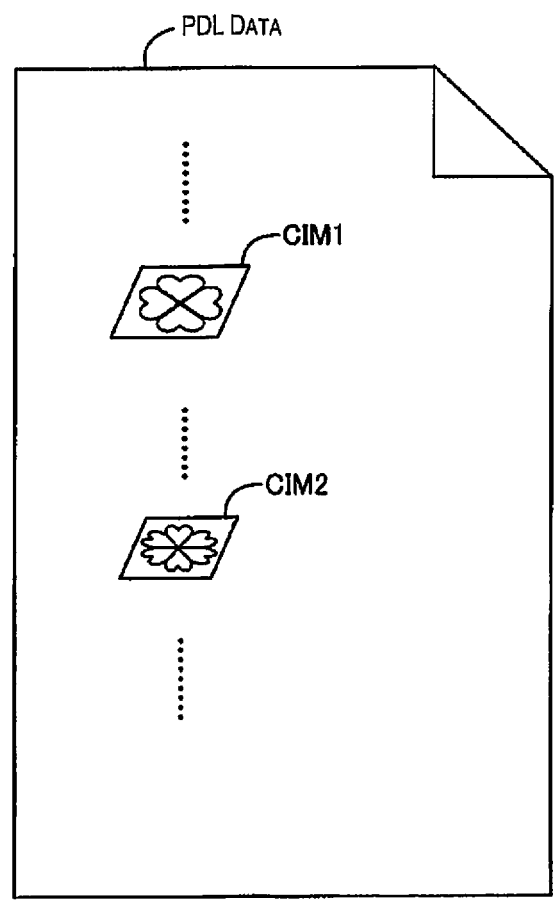
FIG. 5 is a drawing schematically illustrating one example of PDL data.

FIG. 5 schematically illustrates the PDL data that is generated in step S170 (and in step S350 in FIG. 8 described below). As illustrated in FIG. 5, the PDL data includes the compressed image data IM1 (in FIG. 5, the image data CIM1) and the compressed image data IM2 (in FIG. 5, the image data CIM2). The image data CIM1 is in a state of having been compressed by, for example, a JPEG format, and the image data CIM2 is in a state of having been compressed by, for example, an RHV2 format. It shall be readily understood that according to the example in FIG. 3, the PDL data also includes parameters for drawing the graphic image 3.

Figure 6:
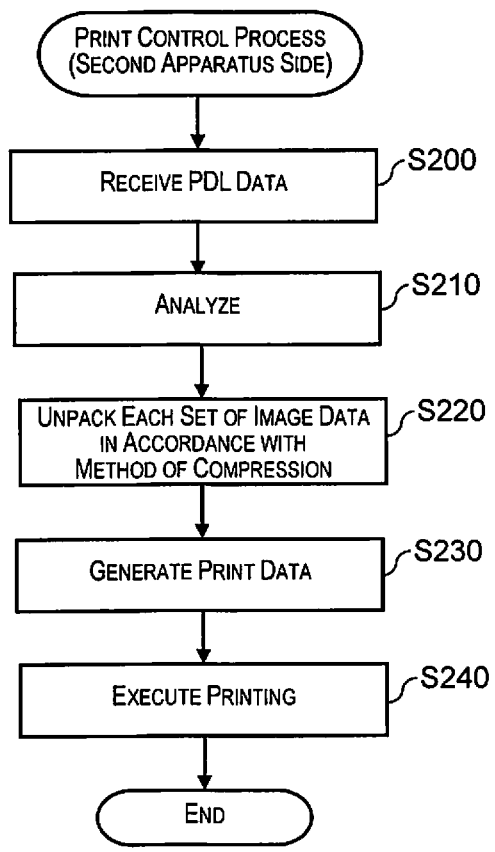
FIG. 6 is a flow chart illustrating a process that is executed on a second apparatus side.

FIG. 6 is a flow chart that illustrates a print control process as in the present embodiment, the process being executed on the second apparatus 50. The flow chart is described herein as being executed by the CPU 51 using the firmware FW. In step S200, the firmware FW receives the PDL data that has been transferred from the first apparatus 10 via the transfer path 70. The firmware FW analyzes the received PDL data (step S210) and acquires the compression method information that has been added to each of the sets of compressed image data included in the PDL data.

In step S220, the firmware FW decompresses each of the sets of compressed image data included in the PDL data by a method of decompressing that corresponds to the method of compression identified by the compression method information. According to the example in FIG. 5, the firmware acquires the image data IM1 by decompressing the image data CIM1 by a JPEG format, and acquires the image data IM2 by decompressing the image data CIM2 by an RHV2 format.

In step S230, the firmware FW generates print data for printing the designated image on the basis of the PDL data and the decompressed image data. In such a case, the firmware FW executes a resolution conversion process for matching the resolutions of each of the sets of decompressed image data IM1, IM2 to the resolution of printing. In so doing, the firmware FW refers to the parameters for defining the positions of each of the objects and the like described in the PDL data, and thereby generates image data of a raster format equivalent to the designated image, in which the image data IM1, IM2 are each arranged in one page. The image data of a raster format equivalent to the designated image can be generated in a one-page increment, or can be generated serially in band units (image regions having a width commensurate with a certain number of pixels in the feeding direction). In a case where the PDL data also includes vector data (for example, the parameters for drawing the graphic image 3) representing graphics or line drawings, then the firmware FW interprets the vector data and deploys same (in what is called a rasterization conversion) to the image data of a raster format, to generate image data of a raster format equivalent to the designated image including the deployed image, data and the image data IM1, IM2.

The firmware FW executes a process for color conversion for the image data of a raster format equivalent to the designated image as needed. In other words, the color system of the image data is converted to an ink color system that the second apparatus 50 uses for printing. For example, in a case where the image data represents the color information of each of the pixels by RGB, as described above, then ink amount data is obtained by converting the RGB to respective gradation values for CMYK at every pixel. The color conversion process can be executed by consulting any desired color conversion look-up table. CMYK are each represented by, for example, 256 gradations. In addition, the firmware FW runs a half tone process (half toning) on the image data (ink amount data) of the raster format equivalent to the designated image after color conversion. There is no particular limitation to the specific technique of the half tone process. The firmware FW can, for example, execute the half tone process by a dithering using a dither mask that is pre-saved in a predetermined storage region, or can execute the half tone process by error diffusion. The half tone process generates half tones (print data) defining the formation of half tone dots (dot-on) or non-formation of half tone dots (dot-off) with the CMYK inks at every pixel.

In step S240, the firmware FW runs a process for sorting the print data generated by the process of step S230 in sequential order of what should be transferred to the print head 62. This sorting process establishes the timings at which each of the half tone dots of each of the inks defined by the print data are to be ejected from the nozzles, in accordance with the pixel positions and ink types thereof. The sorting-processed print data is sequentially transmitted to the AISC 56 by the firmware FW, which thereby causes the dots to be ejected from each of the nozzles. This causes a designated image (see FIG. 3) that is based on the print data to be reproduced on the print substrate.

In this manner, the image acquisition unit 13a acquires the image file 22, which includes on one page a plurality of sets of image data of a raster format for representing objects (for example, includes the image data IM1, IM2), and the compression processing unit 13b selects the methods of compression to apply to each of the plurality of sets of image data IM1, IM2 in accordance with the properties (resolution) of the image data IM1, IM2 from among a plurality of methods of compression, and compresses each of the plurality of sets of image data IM1, IM2 by the respective selected method of compression. In other words, the plurality of sets of image data for representing each of the objects included on one page are compressed by a method of compression that is optimal for the respective resolutions thereof, and therefore transferring the PDL data that includes each of the sets of compressed image data to the second apparatus 50 makes it possible to reduce the length of time needed for transferring of the PDL data. As a result, printing of an unprecedented high speed is realized. The PDL data generation unit 13c, when generating the PDL data to be transferred to the printer (the second apparatus 50), causes the PDL data to include the image data IM1, IM2 (compressed-state image data CIM1, CIM2) without having converted the actual content of the image data IM1, IM2 to a PDL format (vector data). For this reason, it is possible to reliably eliminate the experienced defects where conversion of image data of a raster format into vector data to make PDL data contrarily lowered the printing speed by requiring time for computation processing or increasing the amount of information.

Figure 7:
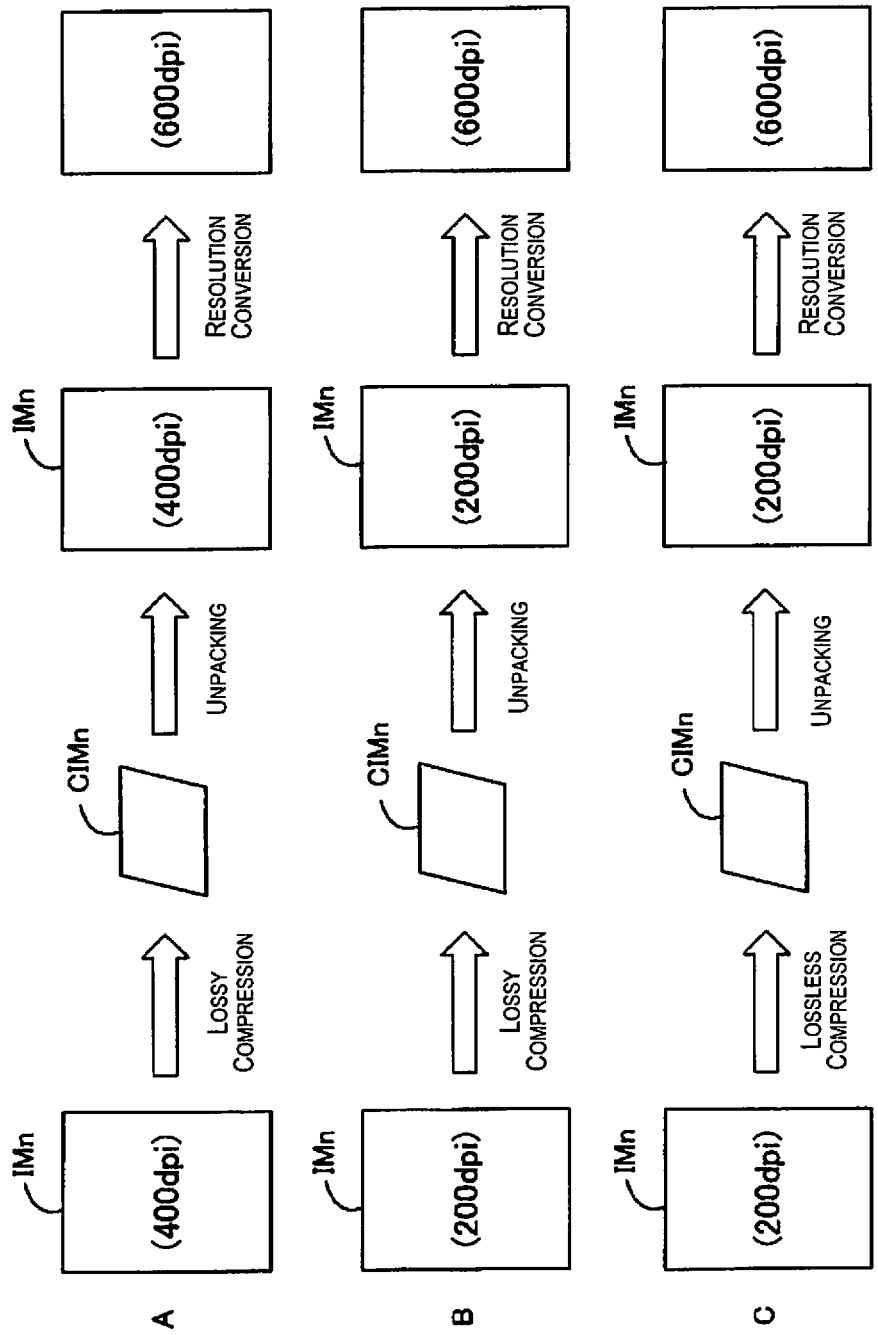
FIG. 7 is a drawing for describing effects achieved by the first embodiment.

Effects of the first embodiment shall be further described below. In FIG. 7, patterns A, B, and C for image data IMn of a raster format provide a simplified illustration of the flow of compressing (step S140 or step S150), decompressing (step S210), and converting the resolution to match the resolution of printing (for example, 600 dpi) (step S230). In the pattern A, the resolution of the image data IMn is 400 dpi, a value which is greater than the threshold TH1 (300 dpi; see FIG. 4) that is set in accordance with the resolution of printing (600 dpi). In the patterns B and C, however, the resolution of the image data IMn is 200 dpi, a value which is smaller than the threshold TH1 that is set in accordance with the resolution of the resolution of printing (600 dpi).

According to the first embodiment, with the pattern A, the image data IMn is subjected to a lossy compression (step S140), and the image data IMn is again obtained by decompressing the compressed image data CIMn. In the pattern A, because the compression is lossy, the decompressed image data IMn experiences some degradation of image quality in comparison to the not-yet-compressed image data IMn. The magnification in the resolution conversion process (enlargement from 400 dpi to 600 dpi), however, is not a very large magnification, and therefore the degradation of image quality in the resolution-converted image is relatively less noticeable. For this reason, the lossy compression, by which a high rate of compression is obtained, is employed with the pattern A. Were the image data IMn of a resolution less than the threshold TH1 to undergo lossy compression, as with the pattern B, however, then because the magnification of the resolution conversion process (enlargement from 200 dpi to 200 dpi) is quite a large magnification, the degradation of image quality caused by the lossy compression is quite noticeable in the resolution-converted image.

Therefore, in the first embodiment, the image data IMn of a resolution less than the threshold TH1 undergoes a lossless compression (step S150), in which there is no degradation of image quality when decompressed, as per the pattern C. According to the pattern C, the magnification of the resolution conversion process (enlargement form 200 dpi to 600 dpi) is a large magnification, as with the pattern B, but because there is no degradation of image quality at the time of decompressing, the image quality remains favorable even in the resolution-converted image. In this manner, in the first embodiment, a switch is made between lossy compression and lossless compression depending on a comparison between the resolution of the image data and a threshold TH1, which is different depending on the resolution of printing. For this reason, regardless of what the value is of the resolution of the final resolution of printing or the resolutions of each of the sets of image data equivalent to each of the objects on the one page, it is possible to select for each of the objects a method of compression that strikes an optimal balance between reducing the amount of information and minimizing any degradation of image quality.

Further, in the first embodiment, the compression processing unit 13b can select a method of compression by lossless compression in a case where the conversion rate in the resolution conversion for matching the resolution of image data to the resolution of printing of the print unit is equal to or greater than a threshold pertaining to this conversion rate, and select a method of compression by lossy compression in a case where this conversion rate is less than the threshold pertaining to the conversion rate. For example, according to FIG. 7, the magnification (a first magnification) of the resolution conversion (enlargement from 400 dpi to 600 dpi) in the pattern A is smaller than the magnification (a second magnification) of the resolution conversion (enlargement from 200 dpi to 600 dpi) of the pattern C. There would be advance determination of, for example, what would be termed a threshold TH3 for diverging such conversion rates. The compression processing unit 13b sets this threshold TH3 in step S120. Then, in step S130, the lossless compression is selected for image data when the conversion rate (magnification) for converting the resolution of that image data to the resolution of printing is equal to or greater than the threshold TH3 (for example, the pattern C), and the lossy compression is selected for the image data in a case where this conversion rate (magnification) is less than the threshold TH3 (for example, the pattern A).

Second Embodiment

The second embodiment shall be described next. In each of the embodiments and other modification examples that are described below, descriptions have been omitted as appropriate for portions in common with embodiments and examples that have been described so far. FIG. 8 is a flow chart that illustrates a print control process as in the second embodiment, the process being executed on the first apparatus 10. Step S300 is similar to step S100. In step S305, the print processing unit 13b acquires the number of pixels for the height (height direction) and width (horizontal direction) of each of the sets of image data of a raster format included in the one page of the designated image. In the example in FIG. 3, the compression processing unit 13b acquires the numbers of pixels for the image data IM1, IM2. These numbers of pixels are acquired by, for example, referring to the appended information for each of the photographic images described in the image file 22 (the so-called Exif information, or the like), or by analyzing the image data IM1, IM2.

In steps S310 to S330, the compression processing unit 13b selects one set of image data (for example, the image data IM1) among the plurality of sets of image data of a raster format included in the one page of the designated image, to serve as image data to be processed, and compares the number of pixels of the image data to be processed with a variety of previously defined thresholds TH21, TH22, TH23, TH24, TH25. The thresholds TH21, TH22, Th23 are all thresholds for comparison with the number of pixels of height of image data, and maintain the relationship TH21<TH22<TH23. The thresholds TH24, TH25 are both thresholds for comparison with the total number of pixels (the number of pixels of height×the number of pixels of width) of image data, and maintain the relationship TH24>TH25. In FIG. 8, as a preferable example, TH21=2, TH22=8, TH23=16, TH24=512, and TH25=256, but the values are TH21, TH22, TH23, TH24, and TH25 are not limited thereto. In the description of steps S310 to S330 that follow, the "number of pixels" signifies the number of pixels involved in the image data to be processed.

The compression processing unit 13b compares the number of pixels of height and the threshold TH21 in step S310, and the flow proceeds to step S335 when the number of pixels of height is equal to or less than the threshold TH21, and proceeds to step S315 in a case where the number of pixels of height is greater than the threshold TH21. In step S315, the number of pixels of height and the threshold TH22 are compared; the flow proceeds to step S320 when the number of pixels of height is equal to or less than the threshold TH22 (in other words, when TH21<number of pixels of height≤TH22), and the flow proceeds to step S325 in a case where the number of pixels of height is greater than the threshold TH22. In step S320, the total number of pixels and the threshold TH24 are compared; the flow proceeds to step S335 when the total number of pixels is equal to or less than the threshold TH24, and the flow proceeds to step S340 in a case where the total number of pixels is greater than the threshold TH24. In step S325, the number of pixels of height and the threshold TH23 are compared; the flow proceeds to step S330 when the number of pixels of height is equal to or less than the threshold TH23 (in other words, when TH22<number of pixels of height≤TH23), and the flow proceeds to step S340 in a case where the number of pixels of height is greater than the threshold TH23. In step S330, the total number of pixels and the threshold TH25 are compared; the flow proceeds to step S335 when the total number of pixels is equal to or less than the threshold TH25, and the flow proceeds to step S340 in a case where the total number of pixels is greater than the threshold TH25.

The compression processing unit 13b compresses the image data to be processed by the method of compression 2 in a case where the flow has proceeded to step S335, and compresses the image data to be processed by the method of compression 1, which is different from the method of compression 2, in a case where the flow has proceeded to step S340. In the second embodiment, as in the first embodiment, the method of compression 1 signifies lossy compression and the method of compression 2 signifies lossless compression. That is to say, in the second embodiment, the image data to be processed undergoes lossless compression when the number of pixels of height is equal to or less than the threshold TH21 (=2), regardless of the total number of pixels. Conversely, when the number of pixels of height is greater than the threshold TH23 (=16), the image data to be processed undergoes lossy compression regardless of the total number of pixels. Also, with TH21<number of pixels of height≤TH22 (=8), then the image data to be processed undergoes lossy compression when the total number of pixels is greater than the threshold TH24 (=512) but undergoes lossless compression when the total number of pixels is equal to or less than the threshold TH24. With TH22<number of pixels of height≤TH23, then the image data to be processed undergoes lossy compression when the total number of pixels is greater than the threshold TH25 (=256) but undergoes lossless compression when the total number of pixels is equal to or less than the threshold TH25. The reason for diverging in this manner is because of the features of the JPEG format being employed as the lossy compression.

With compression processing by JPEG format, compression is executed with a region of 8×8 pixels vertically and horizontally serving as a unit block for processing. At this time, in a case where the number of pixels of height is less than 8, then the computation for compression is performed with pseudo-information added to the vertical direction, and therefore, as a consequence, a high rate of compression is not obtained in some instances. In other words, the lossy compression employed in the second embodiment is a format which fully manifests the effect of compression on image data intended to be compressed when the image data has a certain number of pixels, and in particular when the image data has a certain number of pixels in the vertical direction. For this reason, in steps S310 to S330, a determination is made in accordance with the number of pixels as to whether the image data to be processed is such that the effects of compression by the lossy compression employed in the second embodiment will be fully produced (whether a high rate of compression will be obtained). In this sense, the lossy compression employed in the second embodiment applies as one example of the "specific compression format" in the claims, and the number of pixels of height of the image data to be processed applies as the "number of pixels in the specific direction highly correlated to the compression rate according to the specific compression format" in the claims.

Step S345 is similar to step S160. In the second embodiment, as well, the compression processing unit 13b repeatedly executes such the processes of steps S310 to S345 of such description for each of the plurality of sets of image data of a raster format included in the one page of the designated image (according to the example in FIG. 3, this refers to the image data IM1 and the image data IM2). Steps S350 and S355 are similar to steps S170 and S180. In the second embodiment, as in the first embodiment, the process illustrated in FIG. 6 is executed on the second apparatus 50.

In this manner, the image acquisition unit 13a acquires the image file 22, which includes on one page a plurality of sets of image data of a raster format for representing objects (for example, includes the image data IM1, IM2), and the compression processing unit 13b selects the methods of compression to apply to each of the plurality of sets of image data IM1, IM2 in accordance with the properties (number of pixels) of the image data IM1, IM2 from among a plurality of methods of compression, and compresses each of the plurality of sets of image data IM1, IM2 by the respective selected method of compression. In other words, the plurality of sets of image data for representing each of the objects included on one page are compressed by a method of compression that is optimal for the respective numbers of pixels thereof, and therefore transferring the PDL data that includes each of the sets of compressed image data to the second apparatus 50 makes it possible to reduce the length of time needed for transferring of the PDL data. As a result, printing of an unprecedented high speed is realized.

Also, according to the second embodiment, the question of whether or not the image data is such that the effects of compression imparted by a specific compression format (the JPEG format employed as the lossy compression) are readily manifested is determined in accordance with the number of pixels for each of the plurality of sets of image data for representing each of the objects. The relevant specific compression format is then employed in a case where the image data applies as being such that the effects of compression are readily manifested; in a case where this does not apply, then the lossless compression, which is useful for retaining image quality, is employed. As such, the question of whether to give priority to considerably reducing the amount of information or to retaining image quality is appropriately selected for each of the objects.

Third Embodiment

Figure 9:
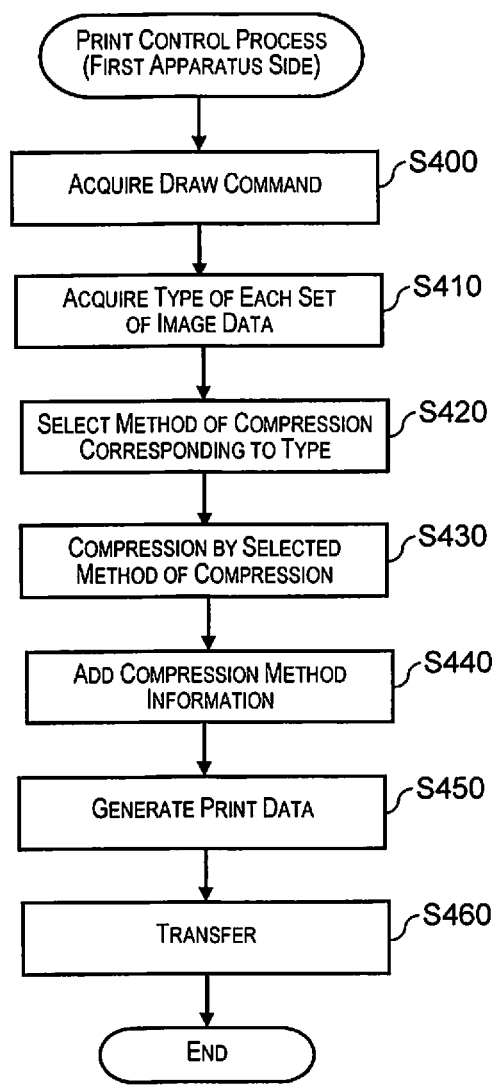
FIG. 9 is a flow chart illustrating a process that is executed on a first apparatus side in a third embodiment.
Figure 10:
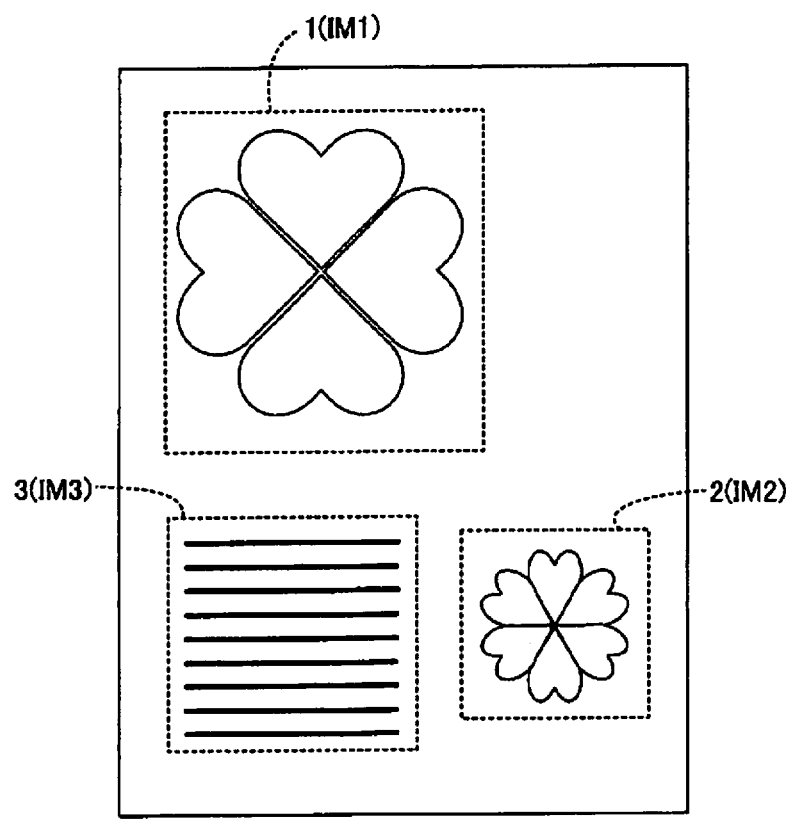
FIG. 10 is a drawing schematically illustrating another example of a designated image.

The third embodiment shall be described next. FIG. 9 is a flow chart illustrating the print control process as in the third embodiment, the process being executed on the first apparatus 10. Step S400 is similar to step S100 (step S300). FIG. 10 is a drawing schematically illustrating one page of a designated image (document) represented by the image file 22 in the third embodiment. The designated image includes, on one page, a plurality of sets of image data of a raster format for representing objects. The designated image includes, for example, the photographic image 1, the photographic image 2, and a character image 3. For example, the photographic image 1 is a color photograph, the photographic image 2 is a monochromatic photograph, and the character image 3 is a plurality of characters (a text document). The photographic image 1, the photographic image 2, and the character image 3 are represented b the image data IM1 of a raster format, the image data IM2 of a raster format, and image data IM3 of a raster format.

In step S410, the compression processing unit 13b acquires the types of each of the sets of image data of a raster format included in the one page of the designated image. "Type" as mentioned herein refers to the type of image content that is represented by each of the sets of image data; types include color photographs, monochromatic photographs, characters, graphics, and the like. In the example in FIG. 10, the compression processing unit 13b acquires the types of images of each of the sets of image data IM1, IM2, IM3. In step S410, consequently it suffices to be able to specify the types of each of the sets of image data. The types thereof can be acquired by, for example, referring to the appended information for each of the images described in the image file 22 (the so-called Exif information, or the like), or by analyzing the image data IM1, IM2, IM3 or the thumbnail images, which are a part of the appended information. In a case where the image data IM1, IM2, IM3 or the thumbnail images are analyzed, then, for example, the histograms of the images could be analyzed to specify whether the images are photographs or artificial images (characters or graphics) and whether the images are color images or monochromatic images, in accordance with the circumstances of distribution of the number of colors or brightness. Moreover, the types could also be specified by carrying out respective detection processes, such as edge detection or character detection, on each of the sets of image data. Alternatively, the compression processing unit 13b can specify the types of the images for each of the sets of image data IM1, IM2, IM3 in accordance with an input from the user.

In step S420, the compression processing unit 13b selects a method of compression to apply to each of the plurality of sets of image data of a raster format included in the one page of the designated image, in accordance with the types of images of each of the plurality of sets of image data. The compression processing unit 13b, for example, selects the JPEG format when an image is a color photograph, selects a run length compression format when an image is a monochromatic photograph or characters, and selects the RHV2 format when an image is a graphic such as a line drawing. A run length compression format refers to a format for compressing by replacing continuous columns of identical symbols with a number indicative of the lengths of the symbol columns, and is a type of lossless compression. Run length compression is suitable as a method of compression to be employed for comparatively simple images such as black and white images. It shall be readily understood that the relationships of correspondence between the types of images and the methods of compression are not limited thereto.

The compression processing unit 13b can finely define the relationships of correspondence between the types of images and methods of compression. For example, with color images, different methods of compression can be selected depending on whether an image is a portrait in which a person is the subject or is a landscape in which the scenery is imaged. For example, with a portrait, a method of compression by lossless compression would be selected to give priority to retaining image quality, or a method of compression can be selected such that the compression rate is increased by greatly compressing the low-frequency component in the JPEG format. With a landscape, a method of compression using a quantization table so as to minimize to a certain extent the compression of the high-frequency component in a JPEG format would be selected. With an image that overall has a considerable amount of reddish coloring, such as photographs imaging an evening scene, degradation caused by JPEG compression is more readily noticeable, and therefore image quality could be retained by a method of compression in which the compression rate is set to a relatively low value while still employing a JPEG format. The compression processing unit 13b could also acquire the types, such as portraits, landscapes, and evening scenes, by either referring to the appended information for each of the images described in the image file 22 (the so-called Exif information, or the like), or by analyzing the image data IM1, IM2, IM3 or the thumbnail images, which are a part of the appended information.

In step S430, the compression processing unit 13b compresses each of the plurality of sets of image data of a raster format included in the one page of the designated image by the methods of compression selected in step S420. Steps S440, S450, and S460 are similar to steps S160, S170, and S180 (and steps S345, S350, and S355). In the third embodiment, as in the first and second embodiments, the process illustrated in FIG. 6 is executed on the second apparatus 50.

Figure 11:
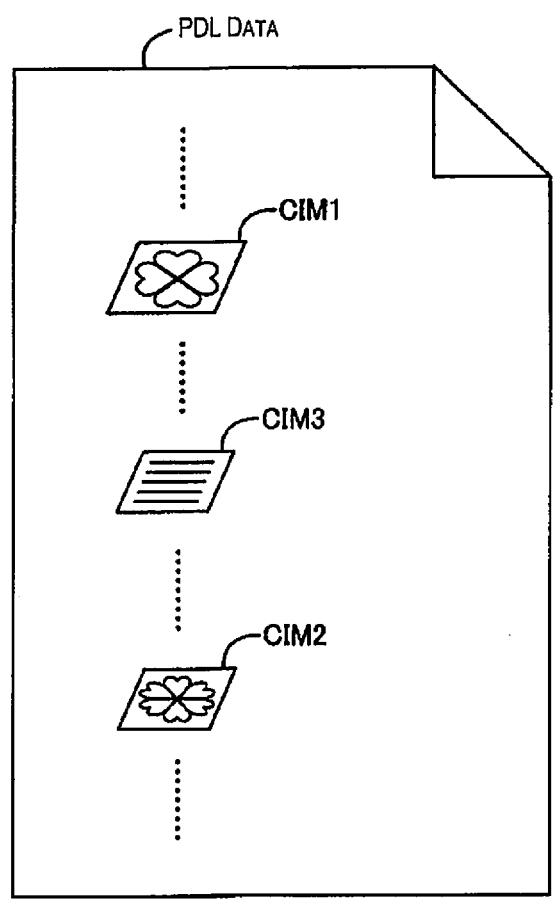
FIG. 11 is a drawing schematically illustrating another example of PDL data.

FIG. 11 schematically illustrates the PDL data that is generated in step S450. As illustrated in FIG. 11, the PDL data includes the compressed image data IM1 (in FIG. 11, this is the image data CIM1), the compressed image data IM2 (in FIG. 11, this is the image data CIM2), and the compressed image data IM3 (in FIG. 11, this is the image data CIM3). The image data CIM1 is in a state of having been compressed by, for example, a JPEG format, and the image data CIM2, CIM3 is in a state of having been compressed by, for example, a run length compression format.

In this manner, the image acquisition unit 13a acquires the image file 22, which includes on one page a plurality of sets of image data of a raster format for representing objects (for example, includes the image data IM1, IM2, and IM3), and the compression processing unit 13b selects the methods of compression to apply to each of the plurality of sets of image data IM1, IM2, and IM3 in accordance with the properties (type of image) of the image data IM1, IM2, and IM3 from among a plurality of methods of compression, and compresses each of the plurality of sets of image data IM1, IM2, and IM3 by the respective selected method of compression. In other words, the plurality of sets of image data for representing each of the objects included on one page are compressed by a method of compression that strikes an optimal balance between minimizing degradation of image quality and the efficacy in reducing the amount of information, in accordance with the types of images. For this reason, transferring the PDL data that includes each of the sets of compressed image data to the second apparatus 50 makes it possible to reduce the length of time needed for transferring of the PDL data. As a result, printing of an unprecedented high speed is achieved, and the degradation of image quality is also minimized.

3. MODIFICATION EXAMPLES

The invention is not limited to the embodiments and examples described above, but rather can be embodied in a variety of modes within a scope that does not depart from the essence thereof; for example, modifications such as the following are also possible. Content obtained by combining as appropriate the embodiments and examples described above and each of the modification examples below is also in the scope of disclosure of the invention.

Modification Example 1

In a case where the first image data and the second image data, which are the plurality of sets of image data of a raster format included on the one page of the designated image, are adjacent to each other, then the compressing processing unit 13b selects, for a range in the first image data of a part that is adjacent to the second image data and a range in the second image data of a part that is adjacent to the first image data, a third method of compression different from both the first method of compression selected for the first image data and the second method of compression selected for the second image data. The ranges for which the third method of compression is selected are compressed by the third method of compression. A more detailed description based on FIG. 12 shall be provided.

Figure 12:
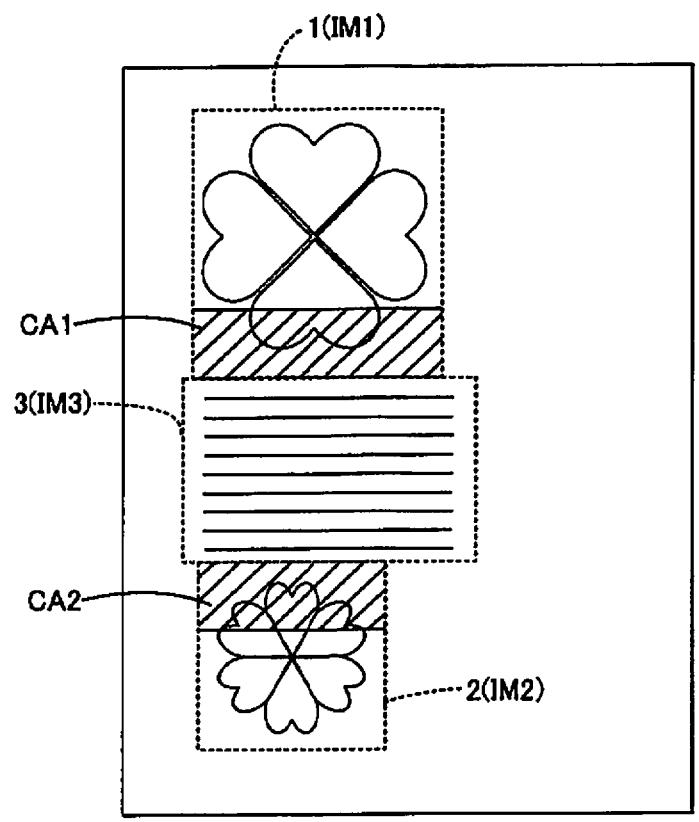
FIG. 12 is a drawing for describing a buffer zone in a designated image.

FIG. 12 is a drawing schematically illustrating one page of a designated image (document) represented by the image file 22. The designated image includes, on one page, a plurality of sets of image data of a raster format for representing objects. The designated image includes, for example, an image 1 represented by the image data IM1 of a raster format, an image 2 represented by the image data IM2 of a raster format, and an image 3 represented by image data IM3 of a raster format. Cases are supposed (steps S140, S150, S335, S340, S420) where, for example, a method of compression by lossy compression, a method of compression by lossy compression, and a method of compression by lossless compression are selected for the image data IM1, for the image data IM2, and for the image data IM3, respectively, in accordance with the respective properties of the sets of image data IM2, IM2, IM3 illustrated in FIG. 12. Here, as illustrated in FIG. 12, the image data IM1 (the first image data) and the image data IM3 (the second image data) are adjacent to one another, and the image data IM2 (the first image data) and the image data IM3 (the second image data) are also adjacent to one another.

When the sets of image data IM2, IM2, IM3 are simply compressed by the respectively selected methods of compression in such circumstances, then there will be a prominent difference in image quality when the images are decompressed between the image data IM1 and the image data IM3, and between the image data IM2 and the image data IM3, possibly causing a nuisance for the user. Therefore, in a case where a plurality of sets of image data of a raster format included in the one page of the designated image are adjacent to one another, then a range in at least one such set of image data of a part that is adjacent to the other set of image data is set as a buffer zone by the compression processing unit. In FIG. 12, a partial range on the image data IM1 side that is in contact with the boundary between the image data IM1 and the image data IM3 is taken as a buffer zone CA1, and a partial range on the image data IM2 side that is in contact with the boundary between the image data IM2 and the image data IM3 is taken as a buffer zone CA2. FIG. 12 illustrates the buffer zones CA1, CA2 with diagonal lines for the sake of facilitating understanding, but such diagonal lines do not necessarily actually exist.

The compression processing unit 13b selects for the buffer zones CA1, CA2 a method of compression that is different from the methods of compression selected for each of the sets of image data that are adjacent to one another, and compresses the buffer zones CA1, CA2 by the selected method of compression. In a case where, as described above, lossy compression (the first method of compression) has been selected for the image data IM1 and lossless compression (the second method of compression) has been selected for the image data IM3, then, for example, a method of compression (third method of compression) which is a lossy compression and is of a lower rate of compression (lesser extent of degradation of image quality) than the lossy compression selected for the image data IM1 is selected for the buffer zone CA1. In a case where, as described above, lossy compression (the first method of compression) has been selected for the image data IM2 and lossless compression (the second method of compression) has been selected for the image data IM3, then, for example, a method of compression (third method of compression) which is a lossy compression and is of a lower rate of compression (lesser extent of degradation of image quality) than the lossy compression selected for the image data IM2 is selected for the buffer zone CA2.

According to the modification example of such description, when the sets of image data IM1, IM2, IM3 are each decompressed, there would be a less prominent difference in image quality between the images 1, 3, and 2 in the designated image, posing less of a nuisance for the user. For the first image data and the second image data to be adjacent to one another is not limited to circumstances of contact but would also include circumstances where the sets of image data are close to one another while maintaining a distance (for example, a distance of several pixels) from one another. Also, either both of or one of the buffer zones CA1, CA2 can either entirely or partially belong to the image data IM3 side.

Modification Example 2

The method of compression executed by the compression processing unit 13b for each of the sets of image data must be a method that can be handled by the printer (the second apparatus 50) (must be a method that allows for the compressed data to be decompressed). Therefore, when selecting the methods of compression in accordance with the properties of each of the sets of image data, the compression processing unit 13b queries the second apparatus 50 via the transfer path 70 regarding the methods of compression that can be handled by the second apparatus 50. The second apparatus 50 replies to the query and responds with all of the methods of compression that can be handled (by the firmware FW). At the compression processing unit 13b, this response is received and methods of compression that apply to each of the sets of image data are selected from among the methods of compression that are included in the response. According to this configuration, it is possible to avoid an event where the compressed image data cannot be decompressed on the second apparatus 50 where the PDL data is received.

Modification Example 3

The difference between the methods of compression selected by the compression processing unit 13b can also be manifest in the rate of compression. In other words, in a case where methods of compression are being selected in accordance with the properties of each of the sets of image data, then the compression processing unit 13b can select, for each of the sets of image data IM1, IM2, methods of compression that are of the same compression format (for example, the JPEG format) and that result in different rates of compression. According to this configuration, with image data of, for example, a low resolution, it is possible to select a method of compression of a lower rate of compression than the method of compression that is selected for image data of a high resolution, thus preventing the prominent appearance of degradation of image quality in the printed result.

Modification Example 3

The compression processing unit 13b can select a method of compression with which there is less compressed data than there is data after the image data has been converted to PDL data in accordance with the properties of each of the sets of image data. The converting of the image data to PDL data is a process for rewriting the image data of a raster format with a page description language (a process for defining the colors and coordinates with vector data). For example, for each of the plurality of sets of image data included in the designated image, the compression processing unit 13b compares the amount of data in a case of conversion to PDL data and the amount of data in a case of compression by a method of compression selected in accordance with the properties of the image data, and in a case where the latter involves less data, determines to employ that selected method of compression. A case where the former were to involve less data is less suitable in terms of reducing the amount of data, and therefore a method of compression (for example, a method of compression that is lossy compression and of a different format or rate of compression, in a case where lossy compression has thus far been selected) distinct from the selected method of compression described above is selected in accordance with the properties of the image data. Then, the amount of data of a case of compression of the image data by that selected distinct method of compression is compared against the amount of data of the case of conversion of the image data to PDL data, and when there is less data than the amount of data in the case of conversion to PDL data, then the employment of that selected distinct method of compression is determined (image data compressed by the that selected distinct method of compression is included in the PDL data and transferred). According to this modification example, it is possible to reliably reduce the amount of information being transferred more so than the case where the image data of a raster format is converted to PDL data and transferred.

Modification Example 5

The first through third embodiments described above can each be executed independently of one another, or can be executed at least partially in combination with one another. For example, the compression processing unit 13b can select the methods of compression in accordance with the resolutions and numbers of pixels of each of the plurality of sets of image data included in the one page of the designated image, can select the method of compression in accordance with the resolutions and types of images, can select the methods of compression in accordance with the numbers of pixels and types of images, or can select the methods of compression in accordance with the resolutions, numbers of pixels, and types of images.

Modification Example 6

Figure 8:
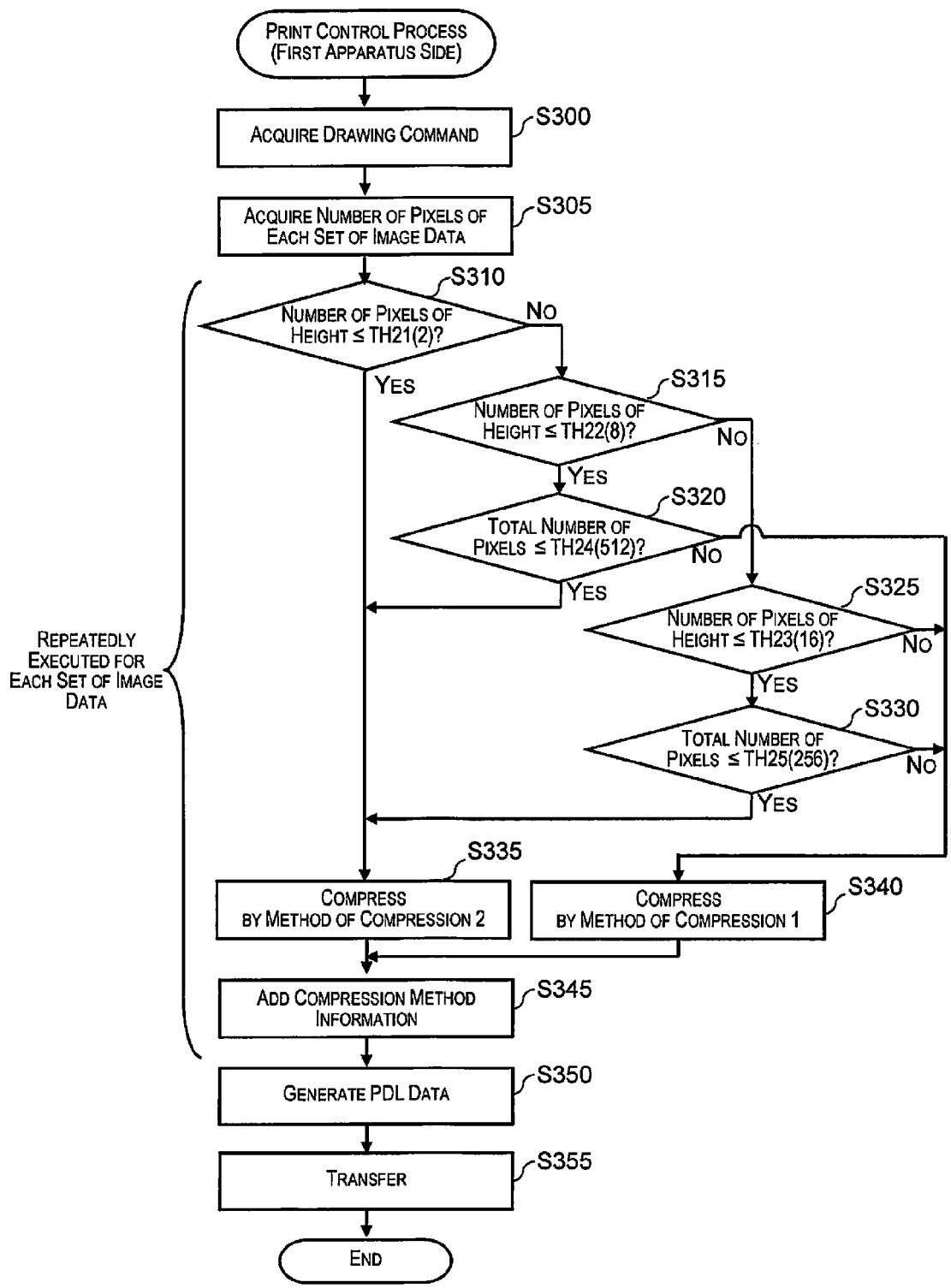
FIG. 8 is a flow chart illustrating a process that is executed on a first apparatus side in a second embodiment.

The print control processes illustrated in FIGS. 2, 8, and 9 can be carried out inside the printer (the second apparatus 50). For example, the CPU 51 can realize each of the functions described above for the image acquisition unit 13a, the compression processing unit 13b, the PDL data generation unit 13c, and the transfer unit 13d, and the process of FIG. 6 can be executed by another control unit inside the printer on the basis of the PDL data transferred to that other control unit by the transfer unit 13d. In such a case, the CPU 51 accepts an operation for a print instruction or the print conditions regarding the designated image from the user via the operation panel 59, an external mobile terminal able to communicate with the second apparatus 50, or the like. Alternatively, the realization of the flow charts of FIGS. 2, 8, and 9 can be shared between the printer driver 13 and the firmware FW.

What is claimed is:

1. A print control apparatus, comprising:
   an image acquisition unit configured to acquire an image file including on one page a plurality of sets of image data of a raster format for representing an object;
   a compression processing unit configured to select methods of compression to apply to each of the plurality of sets of image data from among a plurality of methods of compression, in accordance with the properties of the image data, and compressing each of the plurality of sets of image data by the respectively selected methods of compression;
   a PDL data generation unit configured to generate PDL data, which is PDL data in which a command to print the image file is described by a page description language and which includes the plurality of sets of compressed image data; and
   a transfer unit for transferring the generated PDL data to a print unit,
   the compression processing unit being further configured to repeatedly select methods of compression for each of the plurality of sets of image data,
   wherein in a case where first image data and second image data included in the plurality of sets of image data are adjacent to one another, then the compression processing unit selects, for a range in the first image data of a part that is adjacent to the second image data and a range in the second image data of a part that is adjacent to the first image data, a third method of compression different from both a first method of compression selected for the first image data and a second method of compression selected for the second image data, and compresses the range for which the third method of compression is selected by the third method of compression.

2. The print control apparatus as set forth in claim 1, wherein
   the compression processing unit selects a method of compression with which there is less compressed data than there is data after the image data is converted to PDL data in accordance with the properties of the image data.

3. The print control apparatus as set forth in claim 1, wherein
   the compression processing unit selects a method of compression that is of the same compression format and of a different rate of compression for each of the plurality of sets of image data.

4. The print control apparatus as set forth in claim 1, wherein
   the properties are the resolution of the image data, and the compression processing unit selects the methods of compression in accordance with a comparison between the resolution of the image data and a threshold pertaining to resolution.

5. The print control apparatus as set forth in claim 4, wherein
the compression processing unit selects a method of compression by lossy compression in a case where the resolution of the image data is equal to or greater than the threshold pertaining to resolution, and selects a method of compression by lossless compression in a case where the resolution of the image data is less than the threshold pertaining to resolution.

6. The print control apparatus as set forth in claim 4, wherein
the compression processing unit causes the threshold pertaining to resolution to be different depending on a resolution of printing by the print unit.

7. The print control apparatus as set forth in claim 1, wherein
the properties are the resolution of the image data, and the compression processing unit selects a method of compression by lossless compression in a case where a conversion rate in a resolution conversion for matching the resolution of the image data to a resolution of printing of the print unit is equal to or greater than a threshold pertaining to the conversion rate, and selects a method of compression by lossy compression in a case where the conversion rate is less than the threshold pertaining to the conversion rate.

8. The print control apparatus as set forth in claim 1, wherein
the properties are the number of pixels constituting the image data, and the compression processing unit selects the method of compression in accordance with a comparison between the number of pixels of the image data and a threshold pertaining to the number of pixels.

9. The print control apparatus as set forth in claim 8, wherein
the compression processing unit selects a specific compression format in a case where the number of pixels in a specific direction highly correlated to the compression rate according to the specific compression format is greater than a threshold pertaining to the number of pixels in the specific direction.

10. The print control apparatus as set forth in claim 1, wherein
the properties are the types of images represented by the image data.

11. A non-transitory computer readable medium having a print control program stored thereon to cause a computer to execute:
an image acquisition function configured to acquire an image file including on one page a plurality of sets of image data of a raster format for representing an object;
a compression processing function configured to select methods of compression to apply to each of the plurality of sets of image data from among a plurality of methods of compression, in accordance with the properties of the image data, and compressing each of the plurality of sets of image data by the respectively selected methods of compression;
a PDL data generation function configured to generate PDL data, which is PDL data in which a command to print the image file is described by a page description language and which includes the plurality of sets of compressed image data; and
a transfer function for transferring the generated PDL data to a print unit,
the compression processing function being further configured to repeatedly select methods of compression for each of the plurality of sets of image data,
wherein in a case where first image data and second image data included in the plurality of sets of image data are adjacent to one another, then the compression processing unit selects, for a range in the first image data of a part that is adjacent to the second image data and a range in the second image data of a part that is adjacent to the first image data, a third method of compression different from both a first method of compression selected for the first image data and a second method of compression selected for the second image data, and compresses the range for which the third method of compression is selected by the third method of compression.

* * * * *